United States Patent
Kim et al.

(10) Patent No.: US 9,236,156 B2
(45) Date of Patent: Jan. 12, 2016

(54) PREPARING METHOD OF REDUCED GRAPHENE OXIDE FILM USING A CHEMICAL REDUCTION METHOD AND A PRESSURE-ASSISTED THERMAL REDUCTION METHOD, REDUCED GRAPHENE OXIDE FILM PREPARED BY THE SAME, AND GRAPHENE ELECTRODE INCLUDING THE REDUCED GRAPHENE OXIDE FILM

(71) Applicant: SNU R&DB FOUNDATION, Gwanak-gu, Seoul (KR)

(72) Inventors: Sung Hyun Kim, Seoul (KR); Jyongsik Jang, Seoul (KR); Kyoung-Hwan Shin, Seoul (KR)

(73) Assignee: SNU R&DB FOUNDATION, Seoul (KR)

( * ) Notice: Subject to any disclaimer, the term of this patent is extended or adjusted under 35 U.S.C. 154(b) by 0 days.

(21) Appl. No.: 14/220,399

(22) Filed: Mar. 20, 2014

(65) Prior Publication Data

US 2015/0111039 A1   Apr. 23, 2015

(30) Foreign Application Priority Data

Oct. 18, 2013   (KR) ........................ 10-2013-0124405

(51) Int. Cl.

| C23C 16/40 | (2006.01) |
|---|---|
| C23C 16/50 | (2006.01) |
| H05H 1/24 | (2006.01) |
| H01B 1/04 | (2006.01) |
| H01L 51/00 | (2006.01) |
| H01L 51/05 | (2006.01) |

(52) U.S. Cl.
CPC .............. *H01B 1/04* (2013.01); *H01L 51/0045* (2013.01); *C23C 16/40* (2013.01); *C23C 16/50* (2013.01); *H01L 51/055* (2013.01); *Y10T 428/30* (2015.01)

(58) Field of Classification Search
CPC ........... C23C 16/40; C23C 16/50; H05H 1/24
See application file for complete search history.

(56) References Cited

U.S. PATENT DOCUMENTS

2011/0017585 A1*   1/2011   Zhamu et al. ............ 204/157.42
2011/0133607 A1*   6/2011   Lee et al. ...................... 310/365

(Continued)

FOREIGN PATENT DOCUMENTS

| KR | 1020120008902 A | 2/2012 |
|---|---|---|
| KR | 10-2012-007097 A | 7/2012 |
| KR | 10-2012-0070973 A | 7/2012 |
| KR | 10-2012-0095042 A | 8/2012 |

OTHER PUBLICATIONS

Pei, Songfeng, et al., "The reduction of graphene oxide". Carbon 50 (2012) 3210-3228.*

(Continued)

*Primary Examiner* — Bret Chen
(74) *Attorney, Agent, or Firm* — Brundidge & Stanger, P.C.

(57) ABSTRACT

A preparing method of a reduced graphene oxide film, a reduced graphene oxide film prepared by the preparing method, a graphene electrode including the reduced graphene oxide film, an organic thin film transistor including the graphene electrode, and an antistatic film including the reduced graphene oxide film are provided. The method for preparing a reduced graphene oxide film comprises: coating a graphene oxide-dispersed solution on a substrate to form a graphene oxide thin film; and reducing the graphene oxide thin film using a chemical reduction method and a pressure-assisted thermal reduction method to form a reduced graphene oxide film.

11 Claims, 12 Drawing Sheets

(56) References Cited

U.S. PATENT DOCUMENTS

| | | | |
|---|---|---|---|
| 2012/0190139 A1* | 7/2012 | Na et al. | 438/22 |
| 2013/0102084 A1* | 4/2013 | Loh et al. | 436/94 |
| 2014/0242354 A1* | 8/2014 | Ro et al. | 428/195.1 |

OTHER PUBLICATIONS

Park, Sungjin, et al., "Hydrazine-reduction of graphite- and graphene oxide". Carbon 49 (2011) 3019-3023.*

Chua, Chun Kiang, et al., "Chemical reduction of graphene oxide: a synthetic chemistry viewpoint". Chem. Soc. Rev., 2014, 43, 291-312.*

Kyoung-Hwan Shin et al., "Highly conductive reduced graphene oxide produced via pressure-assisted reduction at mild temperature for flexible and transparent electrodes", The Royal Society of Chemistry, Chem. Commun., 2013, 49, pp. 4887-4889, Apr. 2, 2013.

Yupeng Zhang et al., "High quality graphene sheets from graphene oxide by hot-pressing", CARBON 54 (2013) p. 143-148.

* cited by examiner

PREPARING METHOD OF REDUCED GRAPHENE OXIDE FILM USING A CHEMICAL REDUCTION METHOD AND A PRESSURE-ASSISTED THERMAL REDUCTION METHOD, REDUCED GRAPHENE OXIDE FILM PREPARED BY THE SAME, AND GRAPHENE ELECTRODE INCLUDING THE REDUCED GRAPHENE OXIDE FILM

CROSS-REFERENCE TO RELATED APPLICATION

This application claims the benefit of Korean Patent Application No. 10-2013-0124405 filed on Oct. 18, 2013, the disclosures of which are incorporated herein by reference.

TECHNICAL FIELD

The embodiments described herein pertain generally to a preparing method of a reduced graphene oxide film, a reduced graphene oxide film prepared by the preparing method, a graphene electrode including the reduced graphene oxide film, an organic thin film transistor including the graphene electrode, and an antistatic film including the reduced graphene oxide film.

BACKGROUND

As compared with other preparing methods, solution-based synthesis for producing graphene oxide (GO) through chemical exfoliation from graphite has attracted considerable attention since the graphene oxide can be mass-produced with low manufacturing cost through a solution process. A GO-based flexible transparent conductive film has been studied a lot as a transparent electrode with potential applications as a thin film transistor, a sensor, or an organic photocell device. In general, the GO should be converted into reduced graphene oxide (rGO) in order to restore high conductivity of graphene. So far, there have been a lot of study reports showing various reduction processes. Geng et al. reported a simple method for preparing a transparent conductive graphene film by adjusting chemical reduction of exfoliated GO. Bao et al. reported that a post-annealing process at a high temperature (>800° C.) is needed to obtain rGO having an excellent electrical property. Although it was reported that a conventional thermal reduction process is more effective than a chemical reduction process, since most of the conventional methods are carried out at a high temperature for a long time, it is difficult to apply such methods to a flexible substrate such as plastic. Further, rGO has limitation such as a high surface resistance and a low uniformity, resulting in a low-grade electrical property. Therefore, an alternative GO reduction technique which can be applied to a flexible plastic substrate, and can be carried out rapidly and efficiently with high cost efficiency at a low temperature is still demanded for application of an rGO-based thin film. Meanwhile, Korean Patent Publication No. 2012-0008902 describes that a manufacture method of a partially reduced graphene film by heating and a manufacture method of a counter electrode of a dye-sensitized solar cell, but also has the above-described shortcoming.

SUMMARY

In view of the foregoing, example embodiments provide a preparing method of a reduced graphene oxide film, a reduced graphene oxide film prepared by the preparing method, a graphene electrode including the reduced graphene oxide film, an organic thin film transistor including the graphene electrode, and an antistatic film including the reduced graphene oxide film.

However, problems to be solved by the present disclosure are not limited to the above-described problems. Although not described herein, other problems to be solved by the present disclosure can be clearly understood by those skilled in the art from the following descriptions.

In accordance with a first aspect, a preparing method of a reduced graphene oxide (rGO) film includes: coating a graphene oxide-dispersed solution on a substrate to form a graphene oxide thin film; and reducing the graphene oxide thin film using a chemical reduction method and a pressure-assisted thermal reduction method, respectively, to form a reduced graphene oxide film.

In accordance with a second aspect, a reduced graphene oxide film is prepared by the method according to the first aspect.

In accordance with a third aspect, a graphene electrode includes the reduced graphene oxide film according to the second aspect.

In accordance with a fourth aspect, an organic thin film transistor includes the graphene electrode according to the third aspect.

In accordance with a fifth aspect, an antistatic film includes the reduced graphene oxide film according to the second aspect.

In accordance with the various aspects and example embodiments, since a reduced graphene oxide film is prepared using a pressure-assisted thermal reduction method, an rGO film having an excellent electrical property can be obtained in a very short processing time at a relatively low temperature. Further, since the reduced graphene oxide film prepared using a pressure-assisted thermal reduction method can be prepared at a low temperature, it is advantageous in that it can be applied to a flexible plastic substrate. In particular, since the reduced graphene oxide film of the present disclosure shows a low surface resistance, a low surface roughness, and an excellent electrical property caused by a high carbon/oxygen composition ratio and a dense interlayer structure of the rGO, it can be applied to various fields. Further, a graphene electrode including the reduced graphene oxide film prepared using the pressure-assisted thermal reduction method in accordance with the present disclosure has a low surface roughness and is flexible and transparent with high conductivity, and, thus, it can be an alternative to a conventional expensive metallic electrode by applying the graphene to a gate electrode of an organic electronic device. It can be used for other various purposes, and for example, it can be used as an antistatic film since it can maintain an excellent antistatic property.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
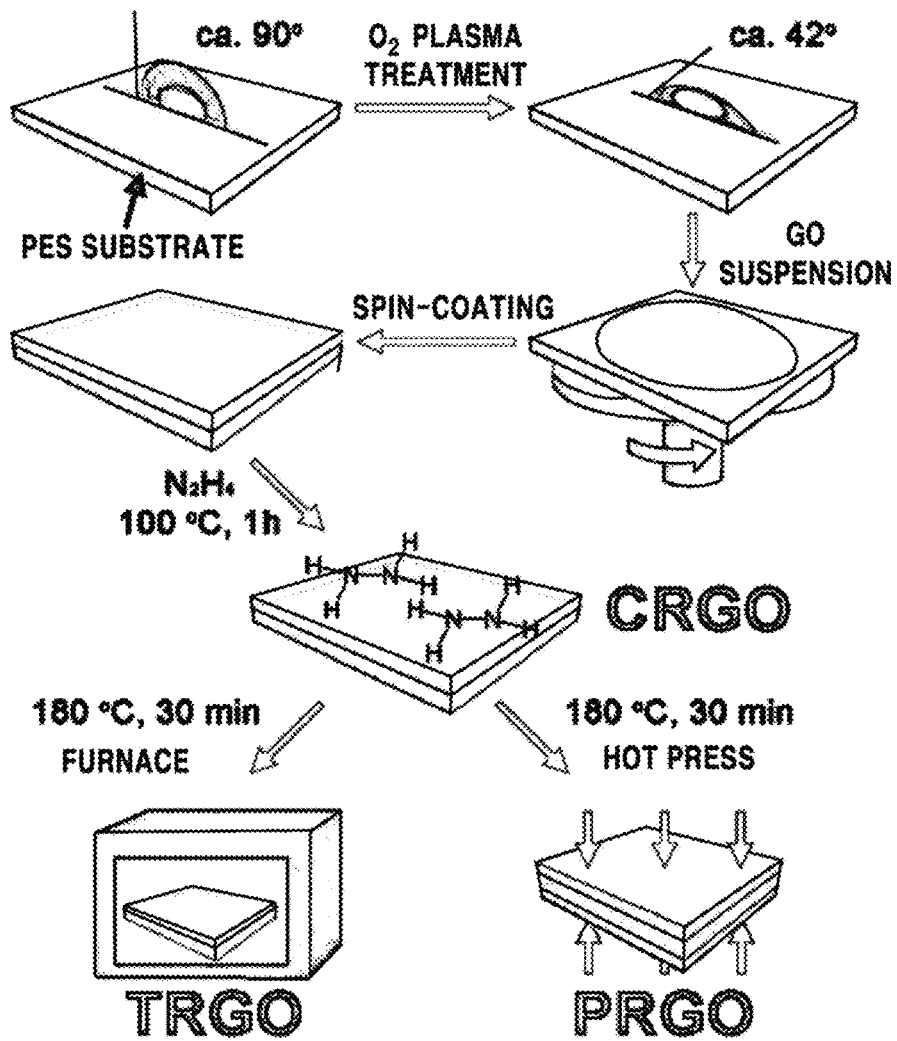
FIG. 1 is a schematic diagram illustrating a preparing method of CRGO, TRGO, and PRGO films in accordance with an example embodiment.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the term "on" that is used to designate a position of one element with respect to another element includes both a case that the one element is adjacent to the another element and a case that any other element exists between these two elements.

Further, the term "comprises or includes" and/or "comprising or including" used in the document means that one or more other components, steps, operation and/or existence or addition of elements are not excluded in addition to the described components, steps, operation and/or elements unless context dictates otherwise.

The term "about or approximately" or "substantially" are intended to have meanings close to numerical values or ranges specified with an allowable error and intended to prevent accurate or absolute numerical values disclosed for understanding of the present disclosure from being illegally or unfairly used by any unconscionable third party.

Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A, B, or A and B".

Through the whole document, the term "graphene" refers to a polycyclic aromatic molecule with multiple carbon atoms covalently bonded to each other. The covalently bonded carbon atoms can form a six-member ring as a repeating unit, and may also include a five-member ring and/or a seven-member ring. Therefore, a sheet formed of the graphene may look as a single layer of carbon atoms covalently bonded to each other, but may not be limited thereto. The sheet formed of the graphene may have various structures, and its structure may vary depending on a content of a five-member ring and/or a seven-member ring which may be contained in the graphene. Further, if the sheet formed of the graphene is made up of a single layer, it may be stacked to form multiple layers, and a side end portion of the graphene sheet may be saturated with, but not limited to, a hydrogen atom.

Through the whole document, the term "graphene oxide" may be abbreviated to "GO". It may have a structure in which a functional group containing oxygen such as a carboxyl group, a hydroxy group, or an epoxy group, etc. is bonded onto a single layer of graphene, but may not be limited thereto.

Through the whole document, the term "reduced graphene oxide" refers to graphene oxide having an oxygen content ratio reduced by a reduction process, and may be abbreviated to "rGO", but may not be limited thereto. The "reduced graphene oxide" may be classified and described in several ways depending on a reduction method of graphene oxide, but may not be limited thereto. By way of example, if GO is reduced chemically, it can be abbreviated to "CRGO", if GO is reduced thermally, it can be abbreviated to "TRGO", and if GO is reduced by a pressure-assisted thermal reduction method, it can be abbreviated to "PRGO", but may not be limited thereto.

Hereinafter, example embodiments of the present disclosure have been explained in detail, but the present disclosure may not be limited thereto.

In accordance with a first aspect, a preparing method of a reduced graphene oxide film includes: coating a graphene oxide-dispersed solution on a substrate to form a graphene oxide thin film; and reducing the graphene oxide thin film using a chemical reduction method and a pressure-assisted thermal reduction method, respectively, to form a reduced graphene oxide film.

In accordance with an example embodiment, the substrate includes a flexible plastic substrate, but may not be limited thereto.

In accordance with an example embodiment, the plastic substrate includes a member selected from the group consisting of polyethersulfone, polyimide, polycarbonate, polyethylene naphthalate, and polyethylene terephthalate, but may not be limited thereto.

In accordance with an example embodiment, the substrate is modified by an oxygen plasma treatment or a nitrogen plasma treatment, but may not be limited thereto. If the substrate is a plastic substrate, surface energy caused by a difference between hydrophobicity of a surface of the substrate and hydrophilicity of the graphene oxide-dispersed solution becomes an important factor for determining linear accuracy of a pattern to be formed. In order to control this, the surface of the plastic substrate is surface-modified, and in this case, a plasma surface treatment method using oxygen or nitrogen may be used. Typically, in addition to the plasma treatment method, the surface modification methods may include a chemical treatment method using a silane coupling agent such as amino silane or a surface coating method using a polymer or an organic compound. However, the chemical treatment method and the surface coating method are carried out through a complicated process, and they are costly and time consuming, and according to these methods, it is difficult to perform uniform coating on a plastic substrate, which makes it difficult to perform an effective surface treatment. Further, in the case of the plasma treatment method, when an inert gas such as helium or neon is used, hydrophobicity of a surface of a plastic substrate is further modified, and, thus, such gases cannot be used.

In accordance with an example embodiment, the graphene oxide-dispersed solution is prepared by dispersing oxidized graphite in water, but may not be limited thereto. The dispersion of the present example embodiment may be carried out using an ultrasonic generator, but may not be limited thereto. The graphene oxide-dispersed solution of the present example embodiment may be prepared to contain the oxidized graphite in an amount of from about 0.05 parts by weight to about 1 part by weight with respect to about 100 parts by weight of the water, but may not be limited thereto. By way of example, the graphene oxide-dispersed solution may be prepared to contain the oxidized graphite in an amount of from about 0.05 parts by weight to about 1 part by weight, from about 0.2 parts by weight to about 1 part by weight, from about 0.4 parts by weight to about 1 part by weight, from about 0.6 parts by weight to about 1 part by weight, from about 0.8 parts by weight to about 1 part by weight, from about 0.05 parts by weight to about 0.8 parts by weight, from about 0.2 parts by weight to about 0.8 parts by weight, from about 0.4 parts by weight to about 0.8 parts by weight, from about 0.6 parts by weight to about 0.8 parts by weight, from about 0.05 parts by weight to about 0.6 parts by weight, from about 0.2 parts by weight to about 0.6 parts by weight, from about 0.4 parts by weight to about 0.6 parts by weight, from about 0.05 parts by weight to about 0.4 parts by weight, from about 0.2 parts by weight to about 0.4 parts by weight, or from about 0.05 parts by weight to about 0.2 parts by weight with respect to about 100 parts by weight of the water, but may not be limited thereto.

In accordance with an example embodiment, the graphene oxide-dispersed solution further includes an alcohol of about 100 volume % or less with respect to a volume of the water, but may not be limited thereto. By way of example, the graphene oxide-dispersed solution may further include an alcohol of from about 1 volume % to about 100 volume %, from about 20 volume % to about 100 volume %, from about 40 volume % to about 100 volume %, from about 60 volume % to about 100 volume %, from about 80 volume % to about 100 volume %, from about 1 volume % to about 80 volume %, from about 20 volume % to about 80 volume %, from about 40 volume % to about 80 volume %, from about 60 volume % to about 80 volume %, from about 1 volume % to about 60 volume %, from about 20 volume % to about 60 volume %, from about 40 volume % to about 60 volume %, from about 1 volume % to about 40 volume %, from about 20 volume % to about 40 volume %, or from about 1 volume % to about 20 volume % or less with respect to a volume of the water, but may not be limited thereto.

In accordance with an example embodiment, the chemical reduction method may employ a method publicly known in the art, and uses a reducing agent selected from the group consisting of, for example, hydrazine, sodium borohydride, and sulfuric acid, but may not be limited thereto. The reducing agent of the present example embodiment may be selected from the group consisting of $H_2$, $SO_2$, $CH_4$, $NH_3$, $H_2S$, HI, HBr, HCl, acetic acid, benzoic acid, formic acid, carbonic acid, and combinations thereof, but may not be limited thereto.

In accordance with an example embodiment, the chemical reduction method is performed at a temperature in a range of from about 70° C. to about 200° C., but may not be limited thereto. By way of example, the chemical reduction method is performed at a temperature in a range of from about 70° C. to about 200° C., from about 80° C. to about 200° C., from about 90° C. to about 200° C., from about 100° C. to about 200° C., from about 110° C. to about 200° C., from about 120° C. to about 200° C., from about 130° C. to about 200° C., from about 140° C. to about 200° C., from about 150° C. to about 200° C., from about 160° C. to about 200° C., from about 170° C. to about 200° C., from about 180° C. to about 200° C., from about 190° C. to about 200° C., from about 70° C. to about 190° C., from about 80° C. to about 190° C., from about 90° C. to about 190° C., from about 100° C. to about 190° C., from about 110° C. to about 190° C., from about 120° C. to about 190° C., from about 130° C. to about 190° C., from about 140° C. to about 190° C., from about 150° C. to about 190° C., from about 160° C. to about 190° C., from about 170° C. to about 190° C., from about 180° C. to about 190° C., from about 70° C. to about 180° C., from about 80° C. to about 180° C., from about 90° C. to about 180° C., from about 100° C. to about 180° C., from about 110° C. to about 180° C., from about 120° C. to about 180° C., from about 130° C. to about 180° C., from about 140° C. to about 180° C., from about 150° C. to about 180° C., from about 160° C. to about 180° C., from about 170° C. to about 180° C., from about 70° C. to about 170° C., from about 80° C. to about 170° C., from about 90° C. to about 170° C., from about 100° C. to about 170° C., from about 110° C. to about 170° C., from about 120° C. to about 170° C., from about 130° C. to about 170° C., from about 140° C. to about 170° C., from about 150° C. to about 170° C., from about 160° C. to about 170° C., from about 70° C. to about 160° C., from about 80° C. to about 160° C., from about 90° C. to about 160° C., from about 100° C. to about 160° C., from about 110° C. to about 160° C., from about 120° C. to about 160° C., from about 130° C. to about 160° C., from about 140° C. to about 160° C., from about 150° C. to about 160° C., from about 70°

C. to about 150° C., from about 80° C. to about 150° C., from about 90° C. to about 150° C., from about 100° C. to about 150° C., from about 110° C. to about 150° C., from about 120° C. to about 150° C., from about 130° C. to about 150° C., from about 140° C. to about 150° C., from about 70° C. to about 140° C., from about 80° C. to about 140° C., from about 90° C. to about 140° C., from about 100° C. to about 140° C., from about 110° C. to about 140° C., from about 120° C. to about 140° C., from about 130° C. to about 140° C., from about 70° C. to about 130° C., from about 80° C. to about 130° C., from about 90° C. to about 130° C., from about 100° C. to about 130° C., from about 110° C. to about 130° C., from about 120° C. to about 130° C., from about 70° C. to about 120° C., from about 80° C. to about 120° C., from about 90° C. to about 120° C., from about 100° C. to about 120° C., from about 110° C. to about 120° C., from about 70° C. to about 110° C., from about 80° C. to about 110° C., from about 90° C. to about 110° C., from about 100° C. to about 110° C., from about 70° C. to about 100° C., from about 80° C. to about 100° C., from about 90° C. to about 100° C., from about 70° C. to about 90° C., from about 80° C. to about 90° C., or from about 70° C. to about 80° C., but may not be limited thereto.

In accordance with an example embodiment, the graphene oxide thin film is reduced by the pressure-assisted thermal reduction method which includes adding heat and pressure to an upper side and a lower side of the substrate on which the graphene oxide thin film is formed, but may not be limited thereto.

In accordance with an example embodiment, the pressure is about 2,000 kgf/cm² or less, but may not be limited thereto. By way of example, the pressure may be in a range of from about 1 kgf/cm² to about 2,000 kgf/cm², from about 200 kgf/cm² to about 2,000 kgf/cm², from about 400 kgf/cm² to about 2,000 kgf/cm², from about 600 kgf/cm² to about 2,000 kgf/cm², from about 800 kgf/cm² to about 2,000 kgf/cm², from about 1,000 kgf/cm² to about 2,000 kgf/cm², from about 1,200 kgf/cm² to about 2,000 kgf/cm², from about 1,400 kgf/cm² to about 2,000 kgf/cm², from about 1,600 kgf/cm² to about 2,000 kgf/cm², from about 1,800 kgf/cm² to about 2,000 kgf/cm², from about 1 kgf/cm² to about 1,800 kgf/cm², from about 200 kgf/cm² to about 1,800 kgf/cm², from about 400 kgf/cm² to about 1,800 kgf/cm², from about 600 kgf/cm² to about 1,800 kgf/cm², from about 800 kgf/cm² to about 1,800 kgf/cm², from about 1,000 kgf/cm² to about 1,800 kgf/cm², from about 1,200 kgf/cm² to about 1,800 kgf/cm², from about 1,400 kgf/cm² to about 1,800 kgf/cm², from about 1,600 kgf/cm² to about 1,800 kgf/cm², from about 1 kgf/cm² to about 1,600 kgf/cm², from about 200 kgf/cm² to about 1,600 kgf/cm², from about 400 kgf/cm² to about 1,600 kgf/cm², from about 600 kgf/cm² to about 1,600 kgf/cm², from about 800 kgf/cm² to about 1,600 kgf/cm², from about 1,000 kgf/cm² to about 1,600 kgf/cm², from about 1,200 kgf/cm² to about 1,600 kgf/cm², from about 1,400 kgf/cm² to about 1,600 kgf/cm², from about 1 kgf/cm² to about 1,400 kgf/cm², from about 200 kgf/cm² to about 1,400 kgf/cm², from about 400 kgf/cm² to about 1,400 kgf/cm², from about 600 kgf/cm² to about 1,400 kgf/cm², from about 800 kgf/cm² to about 1,400 kgf/cm², from about 1,000 kgf/cm² to about 1,400 kgf/cm², from about 1,200 kgf/cm² to about 1,400 kgf/cm², from about 1 kgf/cm² to about 1,200 kgf/cm², from about 200 kgf/cm² to about 1,200 kgf/cm², from about 400 kgf/cm² to about 1,200 kgf/cm², from about 600 kgf/cm² to about 1,200 kgf/cm², from about 800 kgf/cm² to about 1,200 kgf/cm², from about 1,000 kgf/cm² to about 1,200 kgf/cm², from about 1 kgf/cm² to about 1,000 kgf/cm², from about 200 kgf/cm² to about 1,000 kgf/cm², from about 400 kgf/cm² to about 1,000 kgf/cm², from about 600 kgf/cm² to about 1,000 kgf/cm², from about 800 kgf/cm² to about 1,000 kgf/cm², from about 1 kgf/cm² to about 800 kgf/cm², from about 200 kgf/cm² to about 800 kgf/cm², from about 400 kgf/cm² to about 800 kgf/cm², from about 600 kgf/cm² to about 800 kgf/cm², from about 1 kgf/cm² to about 600 kgf/cm², from about 200 kgf/cm² to about 600 kgf/cm², from about 400 kgf/cm² to about 600 kgf/cm², from about 1 kgf/cm² to about 400 kgf/cm², from about 200 kgf/cm² to about 400 kgf/cm², or from about 1 kgf/cm² to about 200 kgf/cm², but may not be limited thereto.

In accordance with an example embodiment, the heat is added at a temperature in a range of from about 70° C. to about 200° C., but may not be limited thereto. By way of example, the heat is added at a temperature in a range of from about 70° C. to about 200° C., from about 70° C. to about 200° C., from about 80° C. to about 200° C., from about 90° C. to about 200° C., from about 100° C. to about 200° C., from about 110° C. to about 200° C., from about 120° C. to about 200° C., from about 130° C. to about 200° C., from about 140° C. to about 200° C., from about 150° C. to about 200° C., from about 160° C. to about 200° C., from about 170° C. to about 200° C., from about 180v to about 200° C., from about 190° C. to about 200° C., from about 70° C. to about 190° C., from about 80° C. to about 190° C., from about 90° C. to about 190° C., from about 100° C. to about 190° C., from about 110° C. to about 190° C., from about 120° C. to about 190° C., from about 130° C. to about 190° C., from about 140° C. to about 190° C., from about 150° C. to about 190° C., from about 160° C. to about 190° C., from about 170° C. to about 190° C., from about 180° C. to about 190° C., from about 70° C. to about 180° C., from about 80° C. to about 180° C., from about 90° C. to about 180° C., from about 100° C. to about 180° C., from about 110° C. to about 180° C., from about 120° C. to about 180° C., from about 130° C. to about 180° C., from about 140° C. to about 180° C., from about 150° C. to about 180° C., from about 160° C. to about 180° C., from about 170° C. to about 180° C., from about 70° C. to about 170° C., from about 80° C. to about 170° C., from about 90° C. to about 170° C., from about 100° C. to about 170° C., from about 110° C. to about 170° C., from about 120° C. to about 170° C., from about 130° C. to about 170° C., from about 140° C. to about 170° C., from about 150° C. to about 170° C., from about 160° C. to about 170° C., from about 70° C. to about 160° C., from about 80° C. to about 160° C., from about 90° C. to about 160° C., from about 100° C. to about 160° C., from about 110° C. to about 160° C., from about 120° C. to about 160° C., from about 130° C. to about 160° C., from about 140° C. to about 160° C., from about 150° C. to about 160° C., from about 70° C. to about 150° C., from about 80° C. to about 150° C., from about 90° C. to about 150° C., from about 100° C. to about 150° C., from about 110° C. to about 150° C., from about 120° C. to about 150° C., from about 130° C. to about 150° C., from about 140° C. to about 150° C., from about 70° C. to about 140° C., from about 80° C. to about 140° C., from about 90° C. to about 140° C., from about 100° C. to about 140° C., from about 110° C. to about 140° C., from about 120° C. to about 140° C., from about 130° C. to about 140° C., from about 70° C. to about 130° C., from about 80° C. to about 130° C., from about 90° C. to about 130° C., from about 100° C. to about 130° C., from about 110° C. to about 130° C., from about 120° C. to about 130° C., from about 70° C. to about 120° C., from about 80° C. to about 120° C., from about 90° C. to about 120° C., from about 100° C. to about 120° C., from about 110° C. to about 120° C., from about 70° C. to about 110° C., from about 80° C. to about 110° C., from about 90° C. to about 110° C., from about 100° C. to about 110° C., from about 70° C. to about 100° C., from about 80° C. to about 100° C., from about 90°

C. to about 100° C., from about 70° C. to about 90° C., from about 80° C. to about 90° C., or from about 70° C. to about 80° C., but may not be limited thereto.

In accordance with an example embodiment, the reduction by adding the heat and the pressure is carried out using an apparatus which is not specifically limited as long as it can apply a pressure and a heat at the same time. By way of example, the reduction by adding the heat and the pressure may include using hot-press or hot-plate, but may not be limited thereto.

In accordance with a second aspect, a reduced graphene oxide film is prepared by the method according to the first aspect. All of the descriptions about the first aspect can be applied to the reduced graphene oxide film of the present aspect. The reduced graphene oxide film is prepared using a pressure-assisted thermal reduction method and can be referred to as "PRGO film" and has a low resistance and a low surface roughness. Since the reduced graphene oxide film exhibits an excellent electrical property caused by a high carbon/oxygen composition ratio and a dense interlayer structure, and, thus, it can be applied to various fields by using such characteristics.

In accordance with a third aspect, a graphene electrode includes the reduced graphene oxide film according to the second aspect. All of the descriptions about the first aspect and the second aspect can be applied to the graphene electrode of the present aspect. Unlike a conventional graphene electrode, the graphene electrode of the present aspect is prepared at a relatively low temperature in a short reduction time and has an excellent electrical property and a low surface roughness, and, thus, can be applied as an electrode of a layered organic electronic device.

In accordance with an example embodiment, the graphene electrode is flexible and transparent, but may not be limited thereto.

In accordance with a fourth aspect, an organic thin film transistor includes the graphene electrode according to the third aspect. All of the descriptions about the first aspect, the second aspect, and the third aspect can be applied to the organic thin film transistor of the present aspect.

In accordance with an example embodiment, the organic thin film transistor includes a graphene electrode which is flexible and transparent, but may not be limited thereto.

The organic thin film transistor may include the graphene electrode as a gate electrode, and the organic thin film transistor may be manufactured by stacking an organic insulating film layer, an organic semiconductor layer, and a source-drain electrode in sequence on the graphene electrode, but may not be limited thereto.

The organic insulating film layer may employ one of those typically used in the art without specific limitation. By way of example, the organic insulating film layer may use polymethylmethacrylate (PMMA) having a high dielectric constant and easily dissolved in an organic solvent such as monochlorobenzene to form a thin film; and polyvinyl pyrrole (PVP) and polyvinyl alcohol dissolved in a solvent such as amoniumdicholoromate, but may not be limited thereto. A method of forming the organic insulating film layer employ one of those typically used in the art without specific limitation. By way of example, there may be used a method of coating an organic insulating material dissolved in a solvent by using, but not limited to, spin-coating, roll-to-roll printing, gravure printing, off-set printing, flexo printing, screen printing, or inkjet printing, or the like. When a thickness of the organic insulating film layer may be in a range of, but not limited to, from about 10 nm to about 1,000 nm, the manufactured organic thin film transistor exhibits excellent performance.

The organic semiconductor layer may be formed with materials typically used in the art without specific limitation. By way of example, the organic semiconductor layer may be formed by thermally depositing a low-molecular organic semiconductor material such as pentacene, or by dissolving a high-molecular material such as poly(2,5-bis(3-hexadecyl-thiophen-2-yl)thieno[3,4-b]thiophene) (PBTTT), 6,13-bis (triisopropylsilylethynyl)pentacene (tips pentacene), or poly (3-hexithiophene) in a solvent such as 1,2,4-trichlorobenzene, cyclohexanol, or dichlorobenzene and then using spin-coating, gravure printing, off-set printing, flexo printing, screen printing, or inkjet printing, but may not be limited thereto.

The source-drain electrode may employ one of materials typically used in the art without specific limitation. By way of example, the source-drain electrode may use metal including gold (Au), silver (Ag), aluminum (Al), nickel (Ni), molybdenum (Mo), tungsten (W), or chromium (Cr) or alloys thereof (for example, molybdenum/tungsten (Mo/W) alloy); metallic oxide including indium tin oxide (ITO) or indium zinc oxide (IZO); and conductive polymers such as polythiophene, polyaniline, polyacetylene, polypyrole, polyphenylene vinylene, or PEDOT (polyethylene dioxythiophene)/PSS (polystyrene sulfonate), but may not be limited thereto.

In accordance with a fifth aspect, an antistatic film includes the reduced graphene oxide film according to the second aspect. All of the descriptions about the first aspect and the second aspect can be applied to the antistatic film of the present aspect. The PRGO film of the present disclosure can be used as an antistatic film since it has a very low sheet resistance and thus can maintain an excellent antistatic property even after a long period of time.

Hereinafter, examples of the present disclosure will be provided for more detailed explanation. However, the following examples just illustrate the present disclosure for easy understanding, but not limit the present disclosure.

EXAMPLE

Example 1

Synthesis of PRGO Film and Organic Thin Film Transistor Using the Same (1) Synthesis of PRGO Film Water-soluble graphene oxide (GO) powder was prepared by a modified Hummer method. A mixture of graphite (1 g), $K_2S_2O_8$ (0.5 g), and $P_2O_5$ (0.5 g) was put into 1.5 mL of a $H_2SO_4$ solution (concentration of from 95 to 98%) at 80° C. for 6 hours (all of the chemical substances were purchased from Sigma Aldrich, St. Louis, Mo., USA). Then, the mixture solution was diluted and filtered and then washed on a filter with deionized water. The washed mixture was dried in a vacuum oven all night long. Thereafter, graphite peroxide (1 g) and $NaNO_3$ (0.5 g) were added to 23 mL of a $H_2SO_4$ solution (concentration of from 95 to 98%) and left at 0° C. for 30 minutes. Then, $KMnO_4$ (3 g) was added to the mixture solution and carefully stirred all night long. Deionized water was added to the mixture solution for 2 hours, and a temperature thereof was slowly increased to 98° C. Thereafter, a $H_2SO_4$ solution in an amount of 30 wt % was added to the mixture and then stirred for 3 hours, so that brown slurry was produced. The slurry was washed with HCl in an amount of 10 wt %. Additional washing with deionized water was carried out in order to neutralize the solution. Finally, after drying, GO powder was obtained. Then, the GO powder was dispersed in deionized water, so that a GO-dispersed solution was prepared. The prepared GO-dispersed solution was stable for several months without external stimulus.

The GO-dispersed solution was mixed with ethanol having 50 volume % with respect to water, so that a final concentration (2 mg/mL) of the GO solution was obtained. Before a spin-coating process, a PES substrate was plasma-processed (200 W, 8 sccm $O_2$) in order to modify wettability of a surface. The substrate was coated with the GO-dispersed solution in a sufficient amount.

Before thermal reduction of the substrate coated with the GO-dispersed solution, hydrazine vapor reduction (chemical reduction) was carried out. The spin-coated GO thin film was put into a clean glass chamber containing 1 mL of hydrazine (30%, Sigma Aldrich). The chamber was sealed and placed in an oven at 100° C. for 1 hour. A color of the GO thin film changed from brown to metallic gray by the chemical reduction (a CRGO film was produced). Then, a pressure-assisted reduction was carried out within a glove box. The CRGO film sample was placed in a hot press between stainless-steel plates and maintained at 180° C. for 30 minutes (a PRGO film was produced) (see FIG. 1).

(2) Manufacturing of Organic Thin Film Transistor Using PRGO Film

An organic thin film transistor was manufactured with a bottom-gate and top-contact configuration. The PRGO film prepared on the PES substrate was used as a gate electrode. Polyvinylpyrrolidone (PVP) as a polymeric insulating material and poly(melamine-co-formaldehyde) as a cross-linking agent were dissolved in propylene glycol monomethyl ether acetate (PGMEA, 10 mL) at a molar ratio of 2:1. The PVP solution was spin-casted on the gate electrode at 4,000 rpm for 30 seconds and subsequently cross-linked at 130° C. for 15 minutes and at 200° C. for 5 minutes in a nitrogen atmosphere, forming a 300 nm PVP gate insulator. On top of the cross-linked PVP insulating layer, a pentacene film was thermally evaporated in a vacuum chamber by a shadow mask under a pressure of $5 \times 10^{-6}$ Torr at room temperature at a deposition rate of 0.4 Å $s^{-1}$. The pentacene semiconductor was 60 nm thick. The gold S/D electrode (50 nm) was thermally deposited on the PES substrate at a deposition rate of about 1.0 Å $s^{-1}$.

Comparative Example 1

Synthesis of TRGO Film

A CRGO film was produced by performing a process in the same manner as Example 1 right before the PRGO was manufactured. The CRGO film was produced by hydrazine vapor reduction, and then, a TRGO film was produced by thermal reduction. The thermal reduction was carried out by heating to 180° C. at a heating rate of 5° C. $min^{-1}$ in a tubular furnace under an argon atmosphere, and maintaining the temperature for 30 minutes.

Experimental Example 1

Scanning Electron Microscopic (FE-SEM) Analysis

Figure 2A:
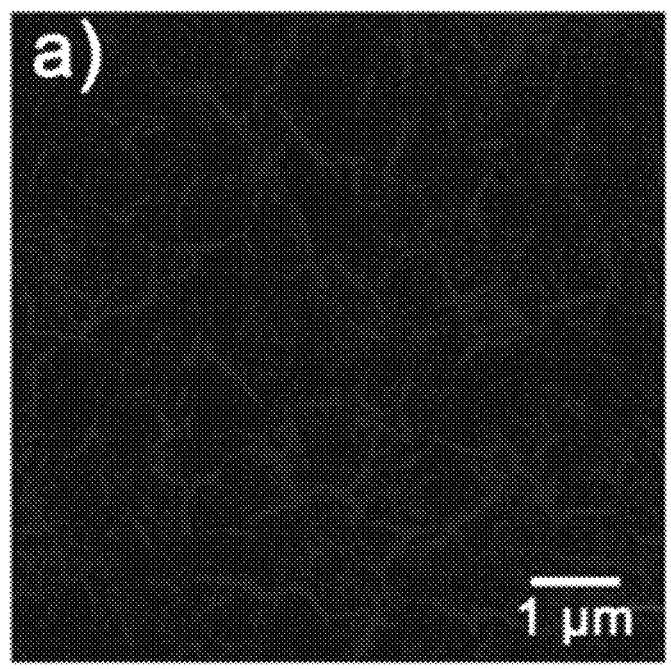
FIG. 2A provides a SEM image of a CRGO film in accordance with an example.
Figure 2B:
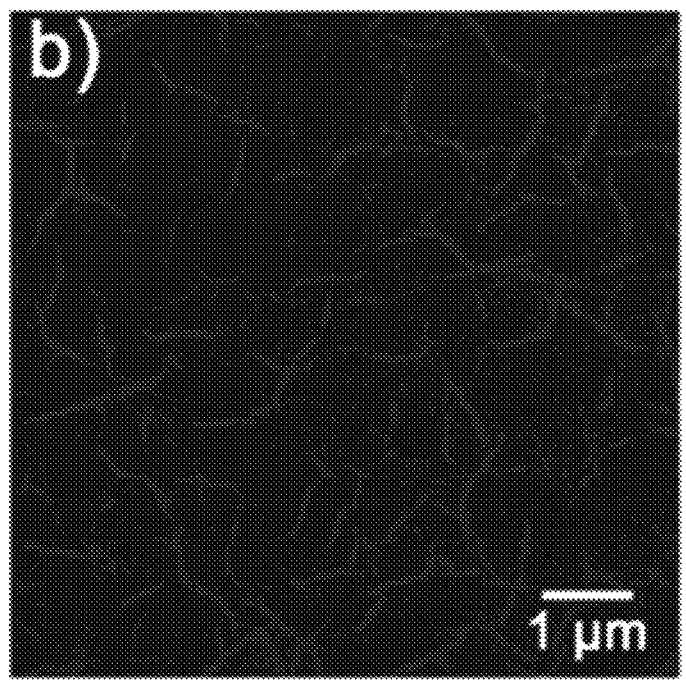
FIG. 2B provides a SEM image of a TRGO film in accordance with an example.
Figure 2C:
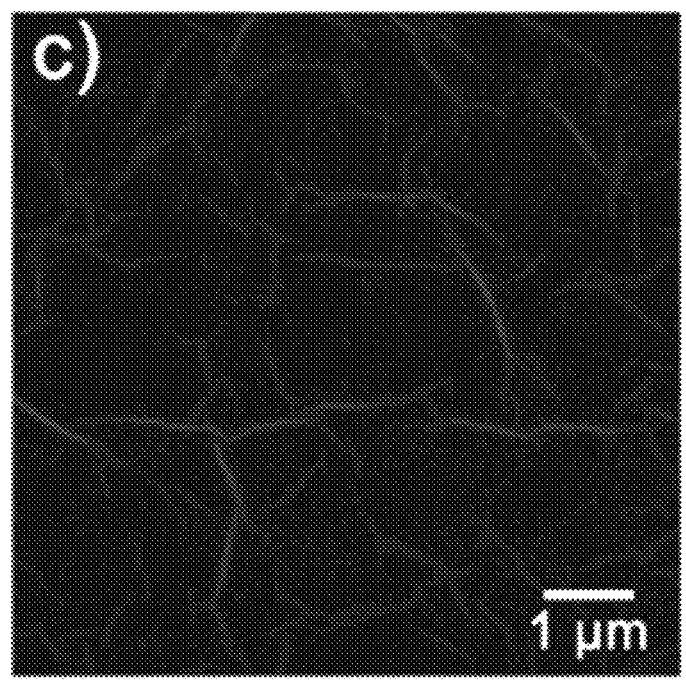
FIG. 2C provides a SEM image of a PRGO film in accordance with an example.

FE-SEM images of the CRGO, TRGO, and PRGO films produced in Example 1 and Comparative Example 1 were observed. A result thereof was as shown in FIG. 2A, FIG. 2B, and FIG. 2C. The FE-SEM images were acquired with a JSM-6700F microscope (JEOL, Tokyo, Japan) at an acceleration voltage of 10 keV. Wrinkles of the CRGO, TRGO, and PRGO films could be observed from the FE-SEM images. The wrinkles as shown in FIG. 2A correspond to images disclosed in documents and were characteristic of the CRGO film. In contrast, it was observed that the TRGO and PRGO films had fewer wrinkles than the CRGO film as shown in FIG. 2B and FIG. 2C. Typically, graphene has a negative thermal expansion coefficient, which causes formation of wrinkles. Such a characteristic can be considerably suppressed when a graphene sheet is bonded to a substrate such as mica. In the present example, a thermal expansion coefficient of the PRGO film moved in a positive direction, there were few wrinkles on the PRGO thin film. In particular, since a PES substrate as a plastic substrate sufficiently interacted with the PRGO sheet, the number of wrinkles was reduced. A pressure applied to the PRGO thin film also improved the interaction between the thin film and the substrate. Wrinkles are defects that increase a sheet resistance, and cause a surface roughness. A surface roughness at a bottom layer of a device often restricts shapes of an interlayer and a top layer, and, thus, a high sheet resistance of the CRGO film and its rough surface may potentially restrict integration of the CRGO film into an organic electronic device, which may result in a highly curved current flow.

Experimental Example 2

Atomic Force Microscopic (AFM) Analysis

Figure 2D:
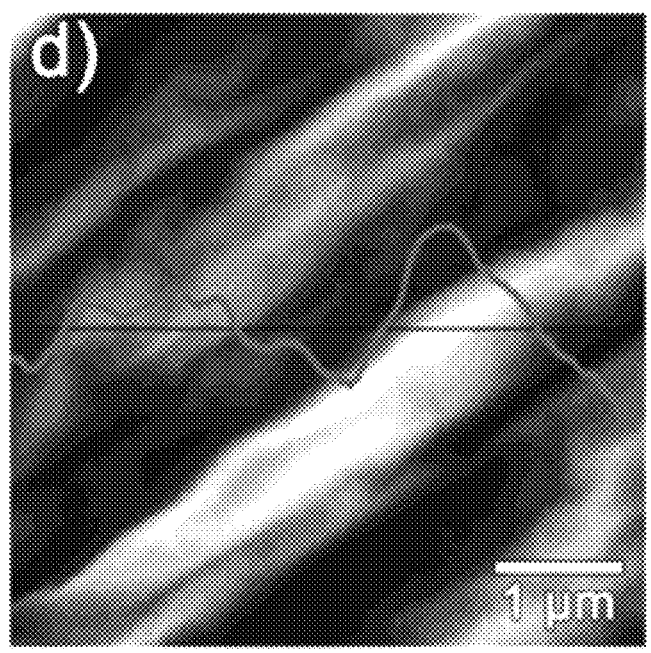
FIG. 2D provides an AFM image of a CRGO film in accordance with an example.
Figure 2E:
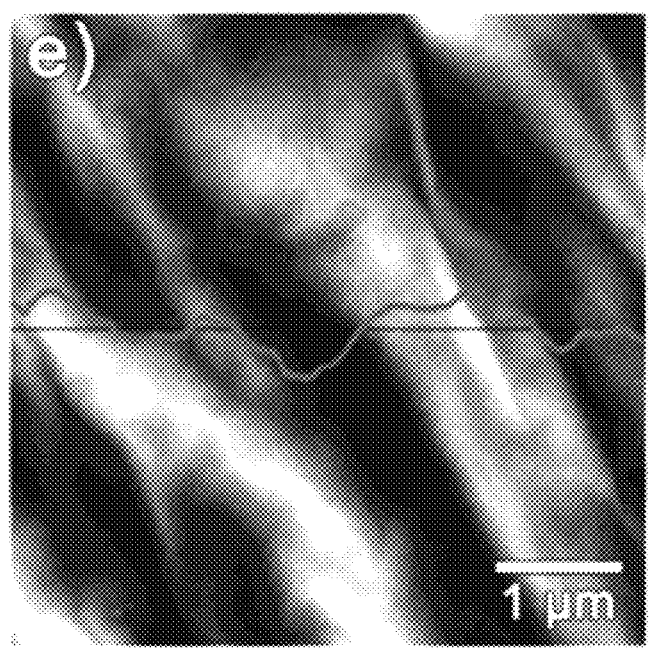
FIG. 2E provides an AFM image of a TRGO film in accordance with an example.
Figure 2F:
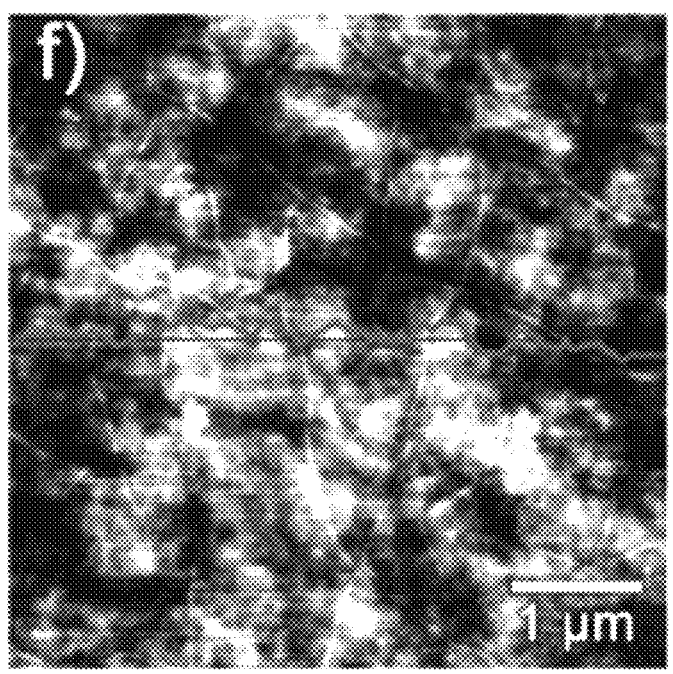
FIG. 2F provides an AFM image of a PRGO film in accordance with an example.

AFM images of the CRGO, TRGO, and PRGO films produced in Example 1 and Comparative Example 1 were observed with an atomic force microscopy (AFM, XE-70; Park Systems, Suwon, Korea) in tapping mode. A result thereof was as shown in FIG. 2D, FIG. 2E, and FIG. 2F. From the AMF images, it was observed that RMS roughness exponents of the CRGO, TRGO, and PRGO films were 10.1±0.02 nm, 4.78±0.02 nm, and 1.61±0.02 nm, respectively. A decrease in surface roughness means that a pressure-assisted reduction process makes it possible to provide a much smoother thin film than a conventional chemical and/or thermal reduction process.

Experimental Example 3

X-ray Photoelectron Spectroscopic (XPS) Analysis

Figure 4A:
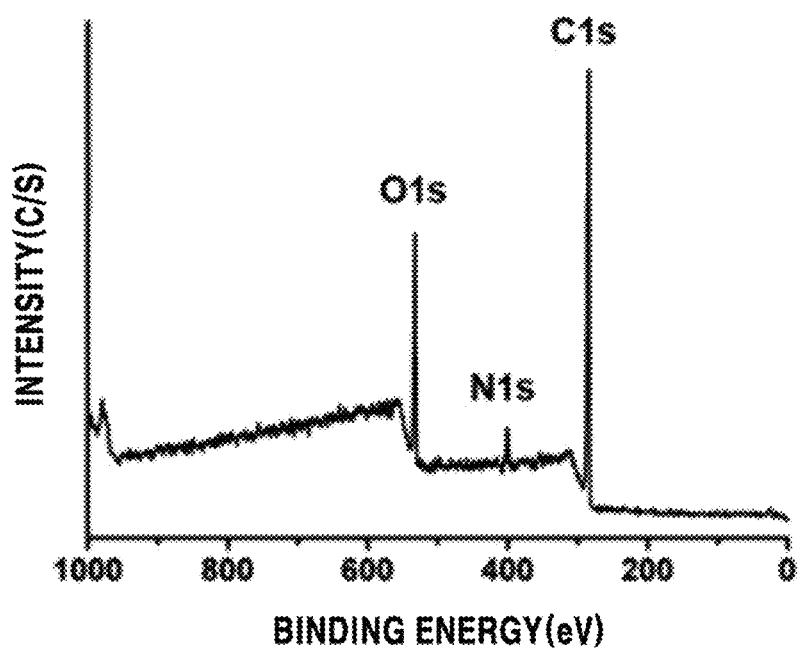
FIG. 4A illustrates an XPS spectrum of a CRGO film in accordance with an example.
Figure 4B:
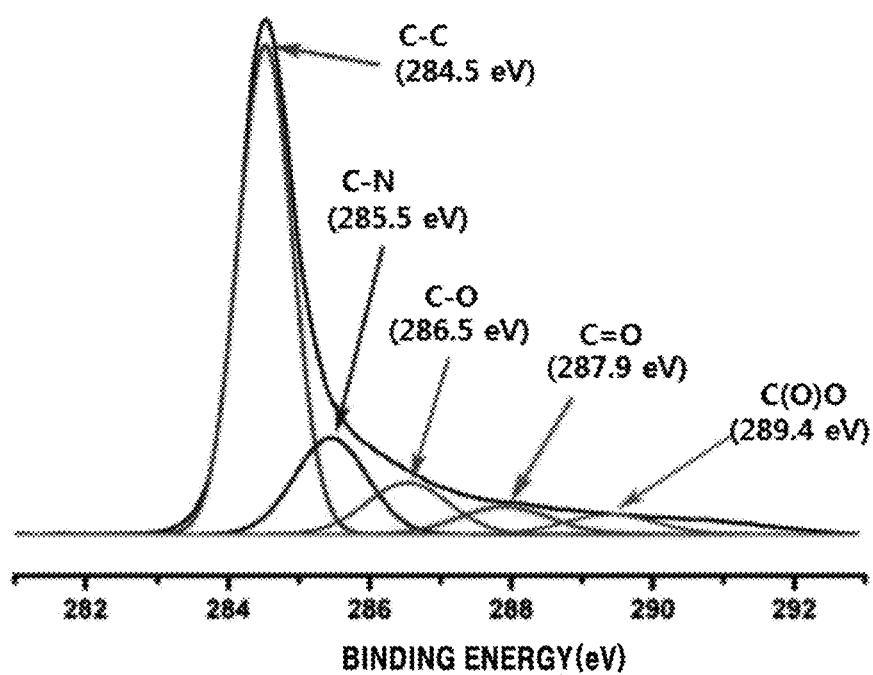
FIG. 4B illustrates an XPS C1 spectrum of a CRGO film in accordance with an example.
Figure 4C:
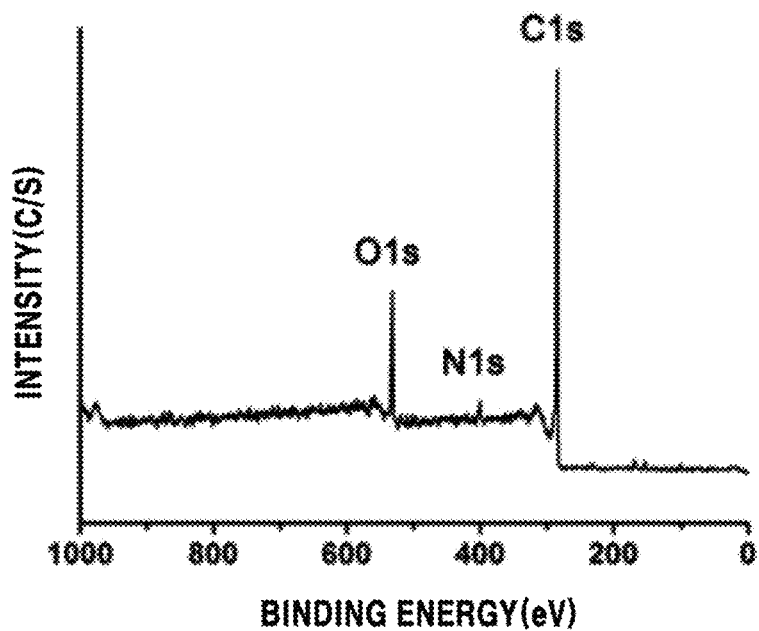
FIG. 4C illustrates an XPS spectrum of a TRGO film in accordance with an example.
Figure 4D:
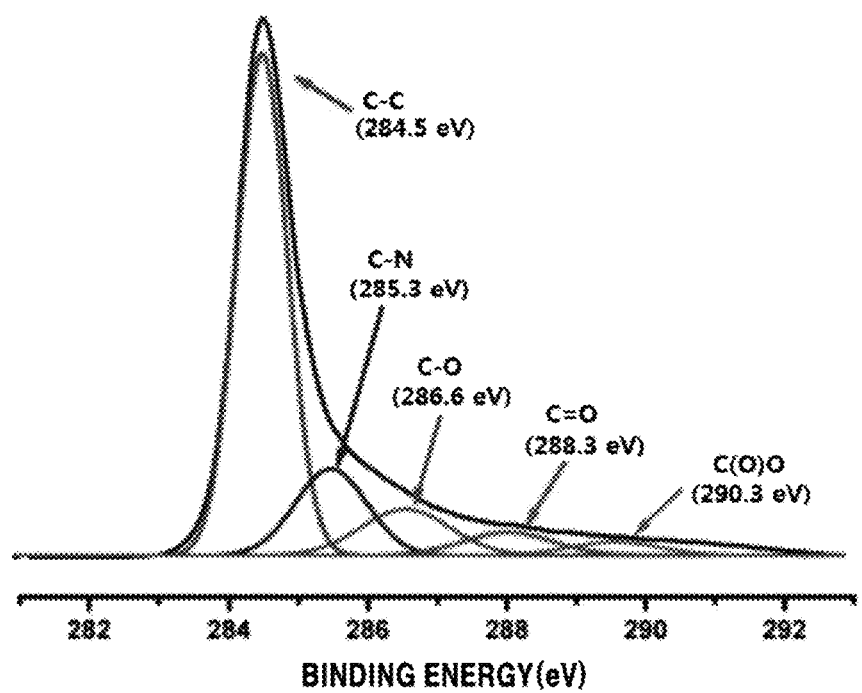
FIG. 4D illustrates an XPS C1 spectrum of a TRGO film in accordance with an example.
Figure 4E:
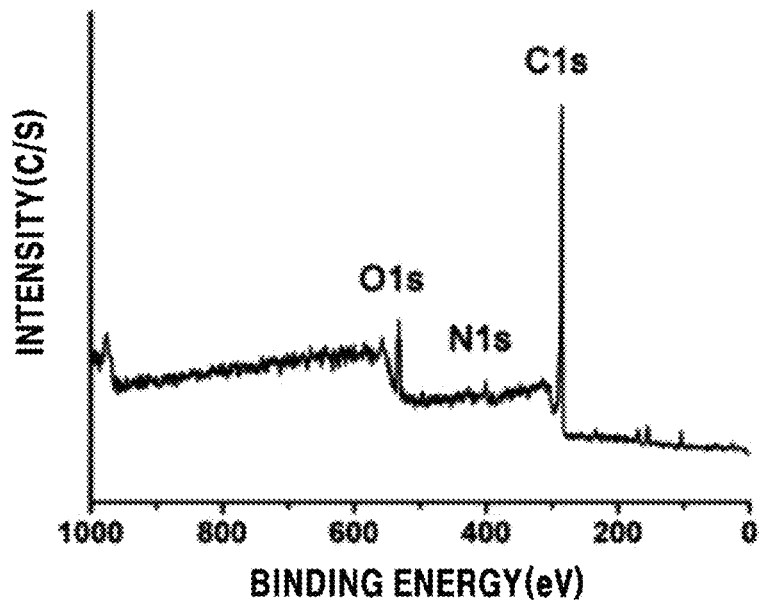
FIG. 4E illustrates an XPS spectrum of a PRGO film in accordance with an example.
Figure 4F:
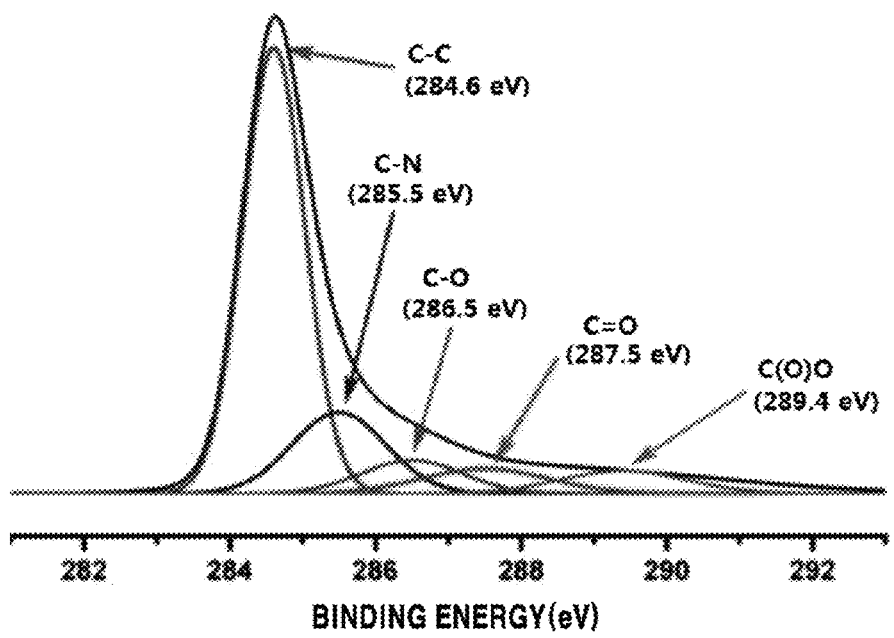
FIG. 4F illustrates an XPS C1 spectrum of a PRGO film in accordance with an example.

X-ray photoelectron spectroscopic (XPS) was performed to determine contents and arrangement of carbon, oxygen, and nitrogen of rGO films produced by different reduction methods. The X-ray photoelectron spectroscopic (XPS) of the present experiment was performed using an ASCALab220i-XL electron spectrometer form VG Scientific with 300 W Al Kα radiation under a pressure of $3 \times 10^{-9}$ mbar. FIG. 4A, FIG. 4C, and FIG. 4E are XPS spectra of CRGO, TRGO, and PRGO films, respectively. FIG. 4B, FIG. 4D, and FIG. 4F are XPS C1 spectra of CRGO, TRGO, and PRGO films, respectively. A conventional CRGO showed four peaks showing the presence of functional groups such as a C—N peak at 285.5 eV, a C—O peak at 285.5 eV, a C=O peak at 287.5 eV, and O—C=O peak at 289.4 eV in addition to a C—C peak at 284.5 eV. As shown in FIG. 4A, FIG. 4C, and FIG. 4E, fewer oxygen and nitrogen were observed from the PRGO film than the CRGO and TRGO films.

Meanwhile, in the present experiment, a C/O atomic ratio was analyzed to evaluate a reduction degree of GR. As shown in Table 1 below, C/O atomic ratios of GO, CRGO, TRGO, and PRGO were 3.0±0.4, 6.9±0.4, 8.6±0.4, and 10±0.4, respectively. A high C/O atomic ratio of the PRGO resulted from a high reduction degree, which offered a higher electrical conductivity as compared with the CRGO and TRGO. These results corresponded to a low sheet resistance of the PRGO.

TABLE 1

|  | GO | CRGO | TRGO | PRGO |
|---|---|---|---|---|
| C/O Atomic ratio | 3.0 ± 0.4 | 6.9 ± 0.4 | 8.6 ± 0.4 | 10 ± 0.4 |

Experimental Example 4

X-ray Diffraction Pattern Measurement

Figure 5:
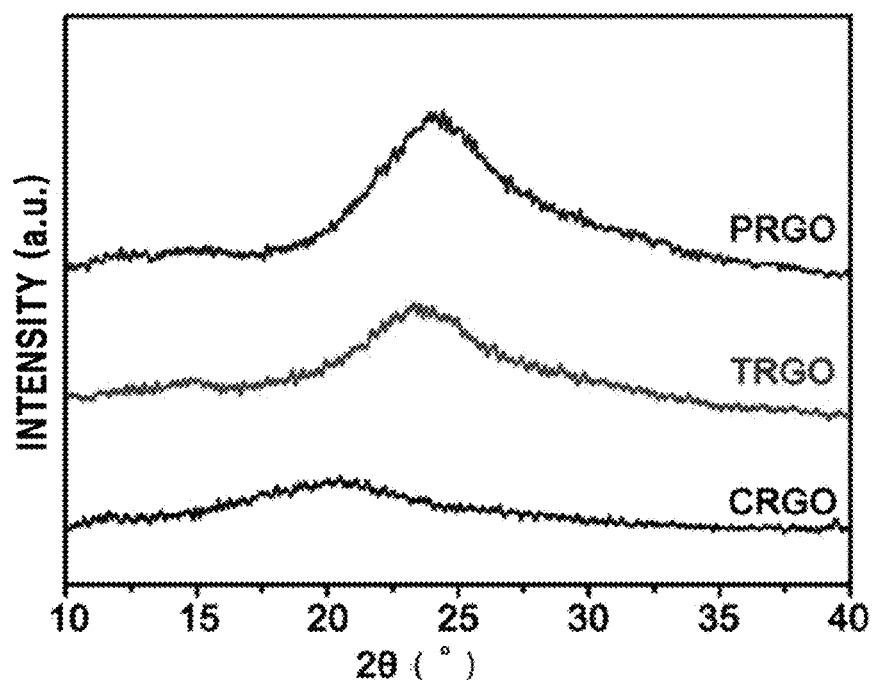
FIG. 5 provides a XRD analysis spectrum of CRGO, TRGO, and PRGO films in accordance with an example.

X-ray diffraction (XRD) analysis of CRGO, TRGO, and PRGO films was performed using an M18XHF-SRA (Mac Science, Yokohama, Japan) diffractometer equipped with a Cu Kα radiation source (k=1.5406 A) at about 40 kV and about 300 mA (12 kW). A result thereof was as shown in FIG. 5.

Figure 3:
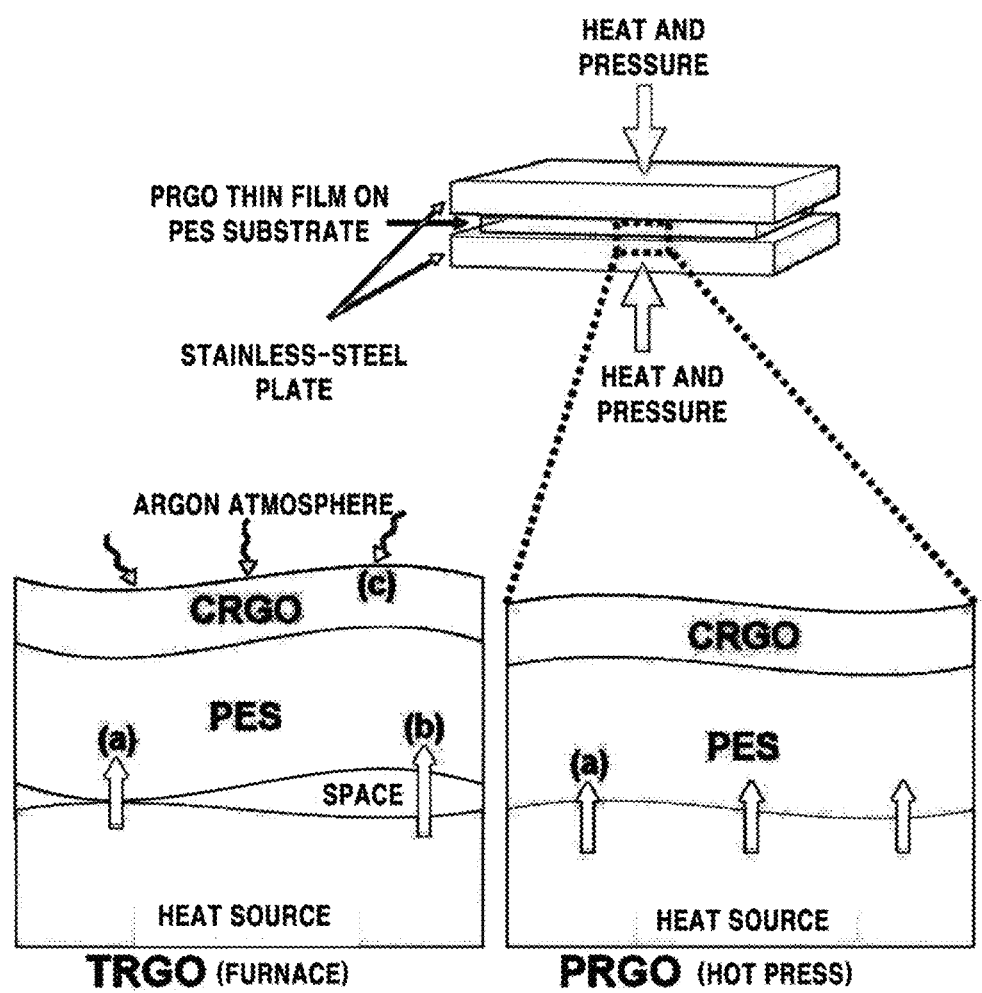
FIG. 3 is a schematic diagram illustrating a comparison in heat flow between a preparing process of a TRGO film and a preparing process of a PRGO film in accordance with an example embodiment.

The X-ray diffraction (XRD) analysis was used to measure an interlayer spacing between graphene multi-layers, which corresponded to a reduction degree of rGO. In FIG. 5, the XRD patterns of rGO prepared using different reduction methods exhibited a peak at around 24°, which is a typical characteristic of rGO. A rGO peak appeared at a higher angle in the PRGO than in the CRGO and TRGO films. The interlayer spacings of the CRGO, TRGO, and PRGO films, calculated based on their 2θ position using Bragg's law, were 0.430±0.02 nm, 0.382±0.02 nm, and 0.364±0.02 nm, respectively. The relatively small interlayer spacing of the PRGO film implies a denser stack of multi-layers compared to the CRGO or TRGO films. These results are similar to the intrinsic interlayer spacing of graphite, which indicates good reduction of GO by a pressure-assisted process. Thus, a small interlayer spacing indicates removal of oxygen- and nitrogen-containing functional groups from GO and subsequent restoration of the $sp^2$ carbon network. Consequently, according to the X-ray diffraction (XRD) analysis, the PRGO thin film had a smaller interlayer spacing than the other films. Therefore, the pressure-assisted reduction process is an alternative method for removing functional groups and impurities at a relatively low temperature. The pressure-assisted reduction process used in the present example provided a result, a PRGO film that has a low sheet resistance and a low surface roughness caused by a high restoration degree of a conjugated π-orbital system and a smaller interlayer spacing as compared with CRGO and TRGO. From this point of view, it is important to understand reduction of GO by a mechanism of a pressure-assisted reduction process. FIG. 3 is a schematic diagram illustrating a comparison in heat flow between a TRGO process and a PRGO process. To be specific, in FIG. 3, (a) is a portion where heat is transferred from a heat source to the CRGO film by a direct contact, (b) is a portion where heat is transferred via a spacing between the heat source and the film by electromagnetic field and/or thermal diffusion, and (c) is a portion where heat is transferred by convection and radiation. A heat flow in different reduction processes is relevant to a reduction efficiency based on a contact area at an interface between a heat source and a PES substrate. In the case of thermal reduction for a TRGO film, surfaces of two bodies formed of floor surfaces including an upper heat source and a PET substrate were not uniform, so that an empty space was formed. Heat transfer through the thermal reduction process may occur not only in the empty space but also between the two solid bodies by thermal diffusion and direct contact. However, in the case of pressure-assisted reduction for a PRGO film, the two bodies between the substrate could be pressed down with a pressure, so that an empty space was minimized and a direct contact area was maximized. A heat flow in the hot press by the direct contact is about 100 times greater than a heat flow in a furnace at the same reduction temperature by indirect convection heat transfer.

Further, an upper body of the hot press is configured to improve heat transfer from a heat source to GO and also confine heat energy to a GO layer. As a result, in the pressure-assisted reduction, sufficient energy to separate a functional group of a GO thin film is transferred, thereby increasing a reduction efficiency and a C/O atomic ratio.

Experimental Example 5

Transmittance Measurement

Figure 6:
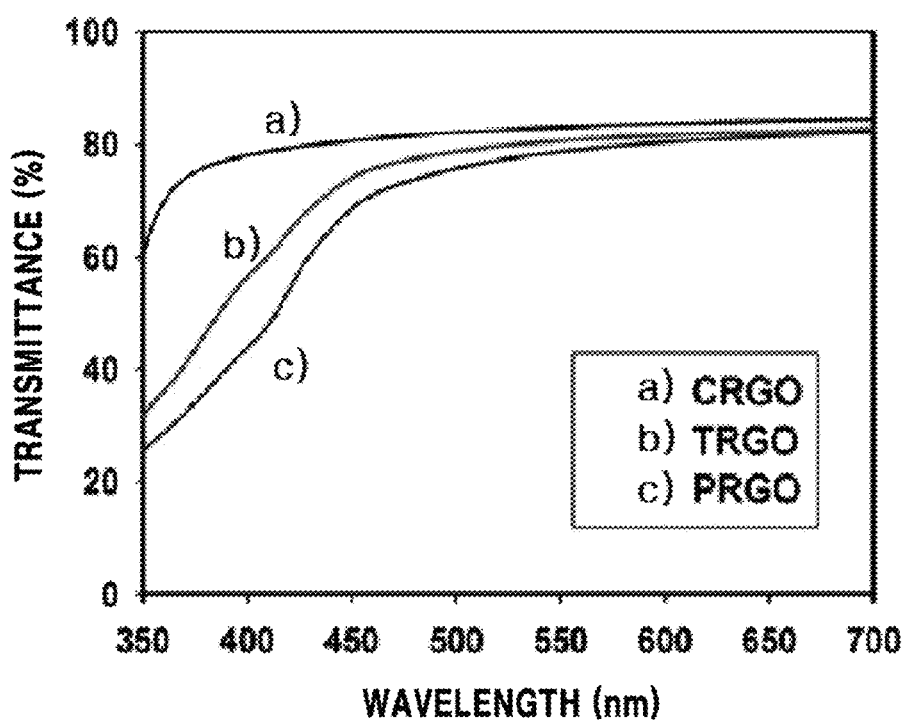
FIG. 6 is a graph illustrating a transmittance of CRGO, TRGO, and PRGO films in accordance with an example.

Transmittances of the films manufactured in Example 1 and Comparative Example 1 was measured using a UV-Vis spectrometer (Lamda-20: Perkin-Elmer, Waltham, Mass., USA) at a resolution of about 1 nm. A result thereof was as shown in FIG. 6. It could be seen that transmittances of the CRGO, TRGO, and PRGO films at about 550 nm were 83.0±3%, 80.6±3%, and 78.8±3%, respectively.

Experimental Example 6

Sheet Resistance Measurement

Figure 7A:
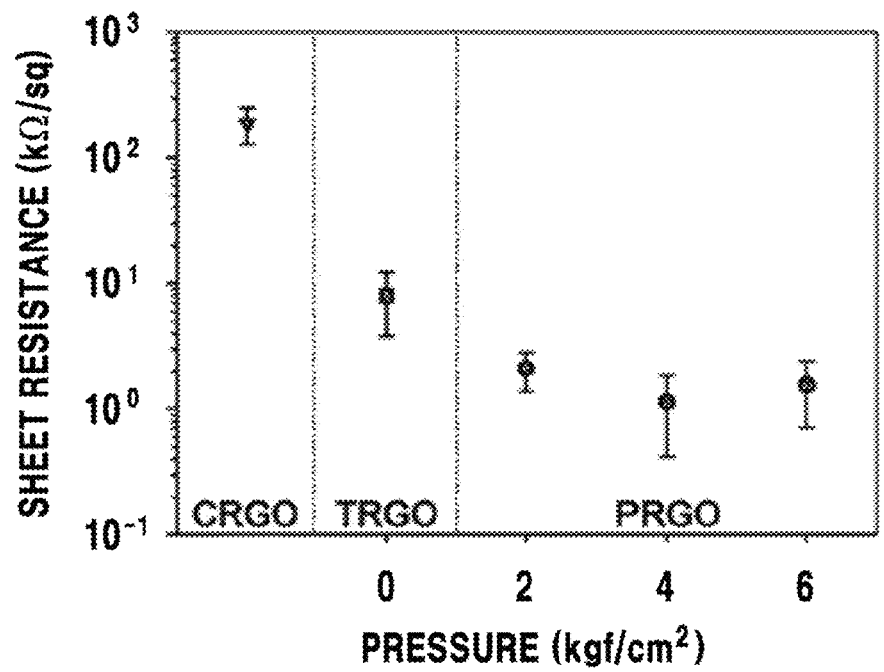
FIG. 7A is a graph illustrating a sheet resistance of CRGO, TRGO, and PRGO films depending on a pressure
Figure 7B:
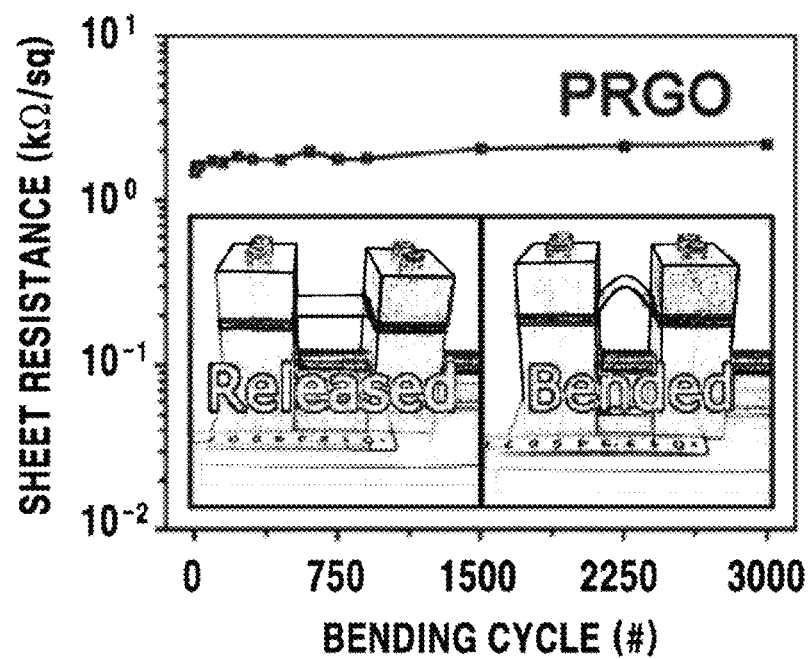
FIG. 7B is a graph illustrating a change in sheet resistance depending on the number of bending cycles of PRGO in accordance with an example.

Sheet resistances of the films manufactured in Example 1 were measured using a 2400 sourcemeter (Keithley, Cleveland, Ohio, USA) at about 25° C. by a four-probe method. A result thereof was as shown in FIG. 7A. It was observed that the lowest sheet resistances of the CRGO, TRGO, and PRGO films were 190 kΩ $sq^{-1}$, 8.0 kΩ $sq^{-1}$, and 1.1 kΩ $sq^{-1}$, respectively. The sheet resistance highly depends on a reduction degree, presence of remaining oxygen and nitrogen atoms, and defects. As for the PRGO film, a sheet surface resistance was measured at various pressures. In the case of manufacturing a PRGO film, when a pressure of 2 kgf/$cm^2$ was applied, a sheet surface resistance was in a range of from 1.1 kΩ $sq^{-1}$ to 2.3 kΩ $sq^{-1}$, and when a pressure of 4 kgf/$cm^2$ was applied, a sheet surface resistance was in a range of from 0.3 kΩ $sq^{-1}$ to 1.7 kΩ $sq^{-1}$, and when a pressure of 6 kgf/$cm^2$ was applied, a sheet surface resistance was in a range of from 0.7 kΩ $sq^{-1}$ to 1.9 kΩ $sq^{-1}$. Besides, in order to check applicability of a PRGO film to a flexible organic electrode, mechanical fatigue was examined using a bending test apparatus. A result thereof was as shown in FIG. 7B. A sheet resistance of the PRGO film was changed until 3000 bending cycles, but after unbending, it was completely restored, and, thus, the PRGO film could be potentially useful for a flexible transparent conductive electrode.

Experimental Example 7

Current-voltage Characteristic Measurement

Figure 8A:
FIG. 8A provides a photograph of an organic thin film transistor in accordance with an example.
Figure 8B:
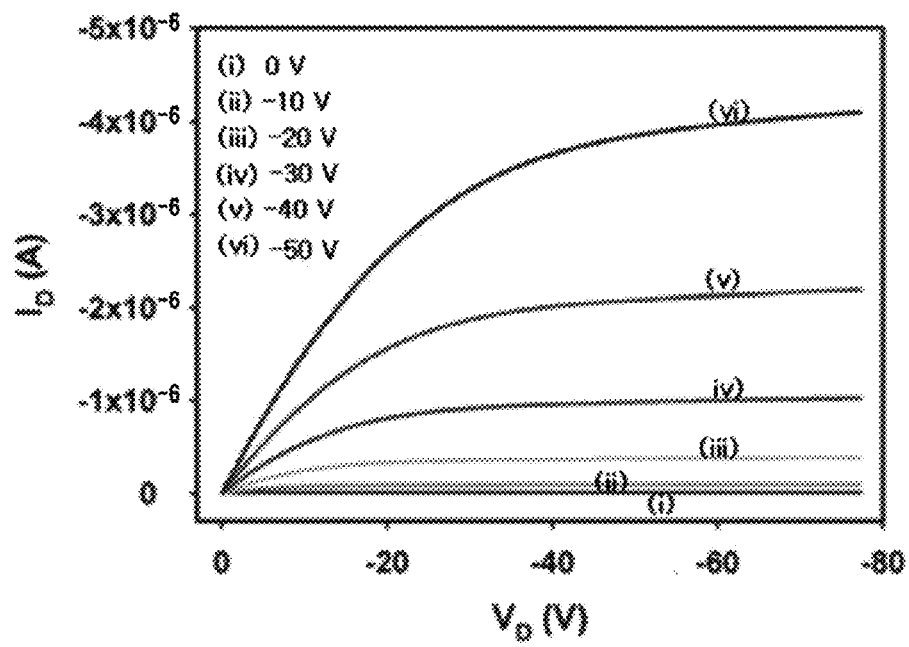
FIG. 8B is a graph illustrating the drain current-drain voltage of an organic thin film transistor in accordance with an example.
Figure 8C:
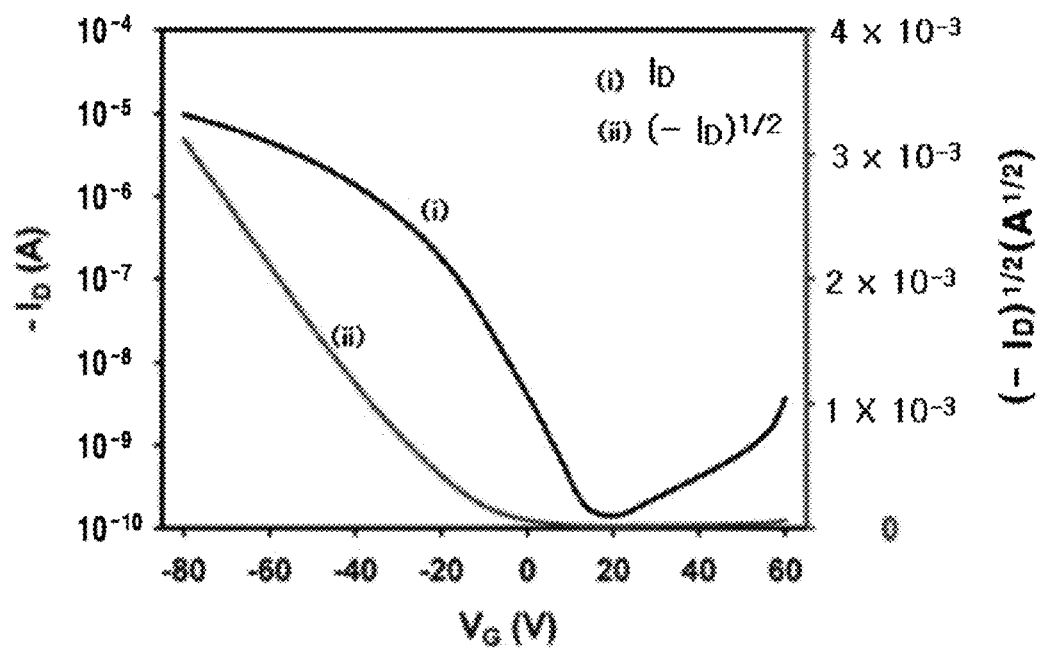
FIG. 8C is a graph illustrating the drain current-drain voltage of an organic thin film transistor in accordance with an example.

A drain current-drain voltage ($I_D$-$V_D$) and a drain current-gate voltage ($I_D$-$V_G$) of the organic thin film transistor (FIG. 8A) prepared in Example 1 were measured using an Agilent HP4155C semiconductor parameter analyzer (Agilent Technologies, Santa Clara, Calif., USA). A result thereof was as shown in FIG. 8B and FIG. 8C. In the present experiment, a field effect mobility (charge carrier mobility) of 0.18±0.04 $cm^2V^{-1}s^{-1}$, a threshold voltage of −18.18 V, and an on/off current ratio (current on/off ratio) of 6.94×10⁴ were obtained. In an organic thin film transistor, a PRGO electrode exhibited an excellent electrical property due to a reduced contact resistance as a result of a smooth surface of a graphene electrode.

To summarize the results of the experimental examples, the PRGO film produced in the example of the present disclosure exhibited excellent photoelectronic property and mechanical flexibility. According to the SEM analysis and the AFM analysis, it was shown that there were few wrinkles on a surface of the PRGO film, resulting in an excellent electrical property. Further, according to the XPS spectrum analysis, removal of functional groups containing oxygen and nitrogen was observed, which corresponded to a small interlayer spacing in the PRGO film. It seems that this characteristic results from an increase in heat flow caused by a wider contact between a heat source and a plastic substrate. Therefore, the PRGO film could be applied to a gate electrode of an organic thin film transistor and exhibited remarkable performance as compared with a conventional gold electrode. Such an approach for reducing graphene oxide has various uses, and can be adjusted in application scope and can also be used for various applications.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A preparing method of a reduced graphene oxide film, comprising:
    coating a graphene oxide-dispersed solution on a substrate to form a graphene oxide thin film; and
    reducing the graphene oxide thin film using a chemical reduction method and a pressure-assisted thermal reduction method to form a reduced graphene oxide film,
    wherein the pressure-assisted thermal reduction method includes adding heat and pressure to an upper side and a lower side of the substrate on which the graphene oxide thin film is formed.

2. The preparing method of a reduced graphene oxide film of claim 1,
    wherein the substrate includes a flexible plastic substrate.

3. The preparing method of a reduced graphene oxide film of claim 2,
    wherein the plastic substrate includes a member selected from the group consisting of polyethersulfone, polyimide, polycarbonate, polyehtylene naphthalate, and polyethylene terephthalate.

4. The preparing method of a reduced graphene oxide film of claim 1,
    wherein the substrate is modified by an oxygen plasma treatment or a nitrogen plasma treatment.

5. The preparing method of a reduced graphene oxide film of claim 1,
    wherein the graphene oxide-dispersed solution is prepared by dispersing oxidized graphite in water.

6. The preparing method of a reduced graphene oxide film of claim 5,
    wherein the graphene oxide-dispersed solution further includes an alcohol of 100 volume % or less with respect to a volume of the water.

7. The preparing method of a reduced graphene oxide film of claim 1,
    wherein the chemical reduction method uses a reducing agent selected from the group consisting of hydrazine, sodium borohydride, and sulfuric acid.

8. The preparing method of a reduced graphene oxide film of claim 1,
    wherein the chemical reduction method is performed at a temperature in a range of from about 70° C. to about 200° C.

9. The preparing method of a reduced graphene oxide film of claim 1,
    wherein the pressure is about 2,000 kgf/cm² or less.

10. The preparing method of a reduced graphene oxide film of claim 1,
    wherein the heat is added at a temperature in a range of from about 70° C. to about 200° C.

11. The preparing method of a reduced graphene oxide film of claim 1,
    wherein the reduction by adding the heat and the pressure includes using hot-press or hot-plate.

* * * * *